United States Patent [19]
Yamazaki et al.

[11] Patent Number: 6,002,101
[45] Date of Patent: *Dec. 14, 1999

[54] METHOD OF MANUFACTURING A SEMICONDUCTOR DEVICE BY USING A HOMOGENIZED RECTANGULAR LASER BEAM

[75] Inventors: Shunpei Yamazaki, Tokyo; Hongyong Zhang; Hiroaki Ishihara, both of Kanagawa, all of Japan

[73] Assignee: Semiconductor Energy Laboratory Co., Ltd., Kanagawa-ken, Japan

[ * ] Notice: This patent is subject to a terminal disclaimer.

[21] Appl. No.: 08/956,438

[22] Filed: Oct. 23, 1997

Related U.S. Application Data

[62] Division of application No. 08/661,869, Jun. 11, 1996, which is a division of application No. 08/245,587, May 18, 1994, which is a division of application No. 08/081,696, Jun. 25, 1993.

[30] Foreign Application Priority Data

Jun. 26, 1992 [JP] Japan ..................................... 4-193005
Aug. 27, 1992 [JP] Japan ..................................... 4-252295

[51] Int. Cl.$^6$ .................................................. B23K 26/00
[52] U.S. Cl. .................................. 219/121.75; 219/121.8; 359/622
[58] Field of Search ................ 219/121.73, 121.75, 219/121.8; 359/487, 621, 622, 619, 628, 495, 196; 117/8, 10, 904; 438/463, 487, 662, 776, 795, 166, 479, 799; 372/101

[56] References Cited

U.S. PATENT DOCUMENTS

| | | | |
|---|---|---|---|
| 3,667,832 | 6/1972 | Kitano et al. ........................... | 359/619 |
| 4,059,461 | 11/1977 | Fan et al. . | |
| 4,309,224 | 1/1982 | Shibata .................................... | 427/555 |
| 4,309,225 | 1/1982 | Fan et al. . | |
| 4,370,175 | 1/1983 | Levatter .................................. | 427/554 |
| 4,379,727 | 4/1983 | Hansen et al. .......................... | 427/555 |

(List continued on next page.)

FOREIGN PATENT DOCUMENTS

| | | | |
|---|---|---|---|
| 55-32026 | 3/1980 | Japan . | |
| 5-8127318 | 10/1983 | Japan . | |
| 5-8191420 | 2/1984 | Japan . | |
| 59-45089 | 3/1984 | Japan ................................. | 219/121.8 |

(List continued on next page.)

OTHER PUBLICATIONS

"Englargement of Poly–Si Film Grain Size by Excimer Laser Annealing and its Application to High–Performance Poly–Si Thin Film Transistor", Hiroyuki Kuriyama et al., Jpn. J. App. Phys., vol. 30, No. 12B, Dec., 1991, pp. 3700–3703.

"Improving the Uniformity of Poly–Si Films Using a New Excimer Laser Annealing Method for Giant–Microelectronics", Hiroyuki Kuriyama et al., Jpn. J. Appl. Phys. vol. 31, Part 1, No. 12B, Dec. 1992, pp. 4450–4554.

"Lateral Grain Growth of Poly–Si Films with a Specific Orientation by an Excimer Laser Annealing Method", Hiroyuki Kuriyama et al., Jpn. J. Appl. Phys. vol. 32 (1993), Pt. 1, No. 12B, pp. 6120–6195.

(List continued on next page.)

*Primary Examiner*—Geoffrey S. Evans
*Attorney, Agent, or Firm*—Sixbey, Friedman, Leedom & Ferguson, PC; Eric J. Robinson

[57] ABSTRACT

A method of manufacturing a semiconductor device by emitting a laser beam from an excimer laser, modifying an energy distribution by passing the beam through a lateral flyeye lens followed by a vertical flyeye lens, condensing the laser beam in two perpendicular sections by two cylindrical lenses to give the beam a rectangular shape, where the longer side can be in excess of 10 cm, then scanning the beam with a single direction over a semiconductor device.

16 Claims, 7 Drawing Sheets

U.S. PATENT DOCUMENTS

| | | |
|---|---|---|
| 4,436,557 | 3/1984 | Wood et al. .............................. 437/19 |
| 4,468,855 | 9/1984 | Sasaki ..................................... 427/555 |
| 4,473,433 | 9/1984 | Bosch et al. ............................ 117/904 |
| 4,475,027 | 10/1984 | Pressley ................................. 219/121 |
| 4,484,334 | 11/1984 | Pressley ................................. 372/101 |
| 4,497,015 | 1/1985 | Kanno et al. ........................... 359/621 |
| 4,500,365 | 2/1985 | Mori ....................................... 427/555 |
| 4,546,009 | 10/1985 | Tiedje et al. ........................... 437/170 |
| 4,646,426 | 3/1987 | Sasaki ..................................... 437/174 |
| 4,662,708 | 5/1987 | Bagdal . |
| 4,733,944 | 3/1988 | Fahlen et al. .......................... 350/167 |
| 4,769,750 | 9/1988 | Matsumoto et al. ................... 359/628 |
| 4,851,978 | 7/1989 | Ichiharg ................................. 359/619 |
| 4,943,733 | 7/1990 | Mori et al. ............................. 250/548 |
| 4,970,366 | 11/1990 | Imatou et al. . |
| 4,997,250 | 3/1991 | Oritz, Jr. ........................... 219/121.75 |
| 5,097,291 | 3/1992 | Suzuki ..................................... 355/69 |
| 5,225,924 | 7/1993 | Ogawa et al. .......................... 359/196 |
| 5,236,865 | 8/1993 | Sandhu et al. ......................... 437/174 |
| 5,263,250 | 11/1993 | Nishiwaki et al. ..................... 29/890.1 |
| 5,304,357 | 4/1994 | Sato et al. ............................... 437/173 |
| 5,306,651 | 4/1994 | Masumo et al. ....................... 437/173 |
| 5,307,207 | 4/1994 | Ichihara ................................. 359/622 |
| 5,372,836 | 12/1994 | Imahashi et al. ...................... 437/173 |
| 5,413,958 | 5/1995 | Imahashi et al. ...................... 437/173 |
| 5,424,244 | 6/1995 | Zhang et al. ........................... 437/173 |
| 5,432,122 | 7/1995 | Chae ...................................... 437/173 |
| 5,561,081 | 10/1996 | Takenouchi et al. .................. 437/184 |
| 5,708,252 | 1/1998 | Shinohara et al. ................. 219/121.73 |

FOREIGN PATENT DOCUMENTS

| | | |
|---|---|---|
| 60-224282 | 11/1985 | Japan . |
| 60-227484 | 11/1985 | Japan . |
| 60-245124 | 12/1985 | Japan . |
| 60-257511 | 12/1985 | Japan . |
| 61-80815 | 4/1986 | Japan . |
| 61-141174 | 6/1986 | Japan . |
| 63-25933 | 2/1988 | Japan . |
| 176715 | 3/1989 | Japan . |
| 64-76715 | 3/1989 | Japan . |
| 1186814 | 7/1989 | Japan .............................. 148/DIG. 3 |
| 64-76715 | 7/1989 | Japan . |
| 1-241862 | 9/1989 | Japan . |
| 1239837 | 12/1989 | Japan . |
| 220681 | 1/1990 | Japan .............................. 219/121.74 |
| 2-73623 | 3/1990 | Japan . |
| 273623 | 5/1990 | Japan . |
| 2-222154 | 9/1990 | Japan . |
| 2294027 | 12/1990 | Japan .................................... 437/174 |
| 2255292 | 7/1991 | Japan . |
| 3-286518 | 12/1991 | Japan . |
| 3286518 | 3/1992 | Japan . |
| 4-307727 | 10/1992 | Japan . |
| 4-338631 | 11/1992 | Japan . |
| 5-21339 | 1/1993 | Japan . |

OTHER PUBLICATIONS

Pennington, K.S. et al., "CCD Imaging Array Combining Fly's Eye Lens with TDI for Increasing Light–gathering Ability", IBM Technical Disclosure Bulletin, vol. 21, No. 2, Jul. 1978, pp. 857–858.

"Formation of p–n Junctions and Silicides in Silicon Using a High Performance Laser Beam Homogenization System", M. Wagner et al., Applied Surface Science 43 (1989), pp. 260–263.

"Crystallization of Amorphous Silicon by Excimer Laser Annealing with a Line Shape Beam Having a Gaussian Profile", Young Min Jhon et al., Jpn. J. Appl. Phys. vol. 33 (1994), pp. L1438–1441.

"Poly–Si by Excimer Laser Annealing with Solidification Process Control", Shigeru Noguchi et al., C–II, vol. J76–C–II, No. 5, 1993, pp. 241–248.

"P–28: 3.7–in.–Diagonal STN–LCD with Stripe Electrode Patterns Fabricated by an Excimer–Laser Scribing System" T. Konuma et al., Semiconductor Energy Laboratory Co., Ltd., 550 . SID 93 Digest.

IEEE Transactions on Electron Devices, vol. 36, No. 12, Dec. 1989; "High–Performance TFT's Fabricated by XeCl Excimer Laser Annealing of Hydrogenated Amorphous––Silicon Film", Kenji Sera et al.; pp. 2868–2872.

English Translation of Japanese Application No. 64–76715, Publication Date of Mar. 22, 1989.

English Translation of Japanese Application No. 2–73623, Publication Date of Mar. 13, 1990.

English Translation of Japanese Application No. 3–286518, Publication Date of Dec. 17, 1991.

"Applications of Excimer Lasers in Microelectronics", Tim McGrath, Lasertechnics, Inc., Albuquerque, New Mexico, Solid State Technology/Dec. 1983, pp. 165–169.

Special Article: Present Situation of Laser Processing Technique, Application of Surface Modification by $CO_2$ Laser, Akira Morikawa et al., Laser Group, Engineering Section, Mechatronics Apparatus Division, pp. 68–69.

Excimer Laser Annealed Poly–Crystalline Silicon TFT, Setsuo Kaneko, T. IEEE Japan, vol 110–A, No. 10, 1990, pp. 679–683.

Semiconductor World, Chapter 2, Active Element Array Forming Technology Annealing Apparatus, Excimer Laser Annealing Apparatus Leonix, 1993, pp. 196–197.

"XeCl Excimer Laser Annealing Used to Fabricate Poly–Si TFT's", Toshiyuki Sameshima et al., Japanese Journal of Applied Physics, vol. 28, No. 10, Oct. 1989, pp. 1789–1793.

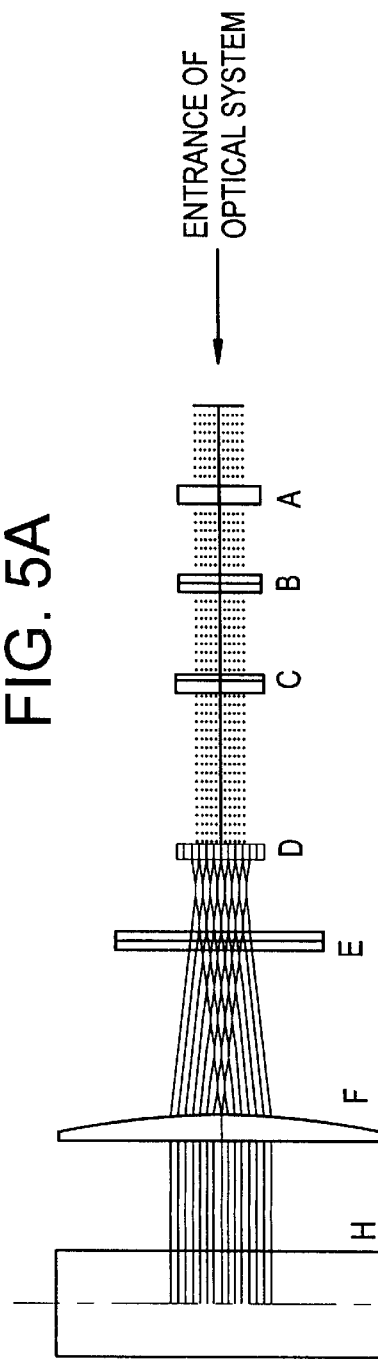
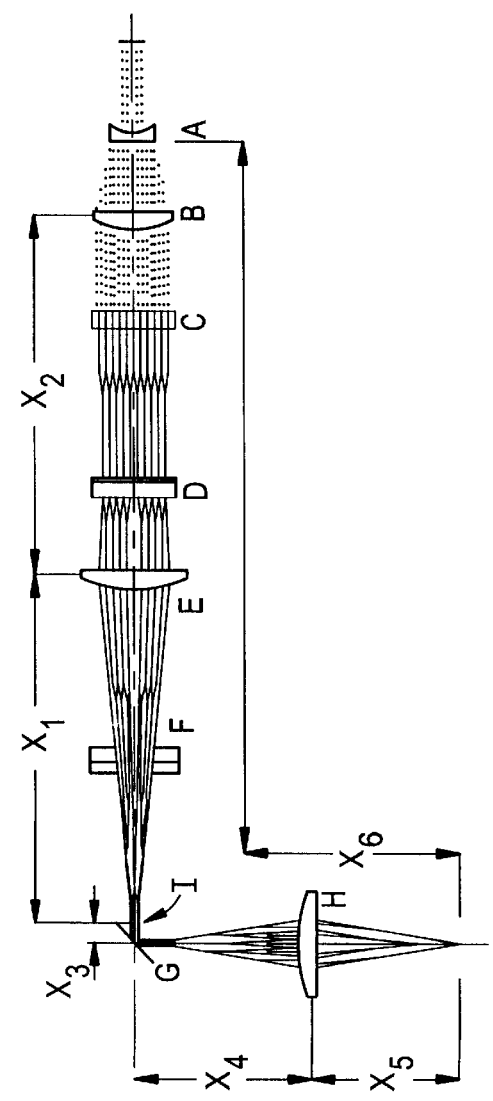
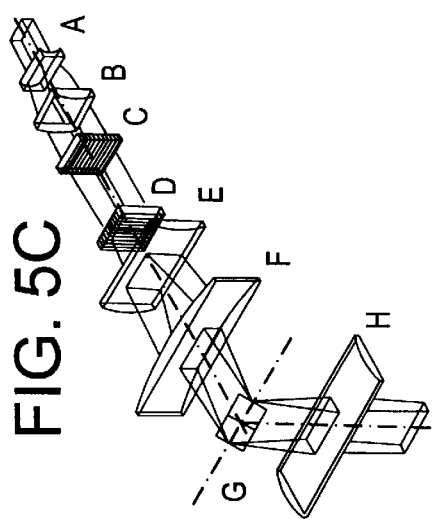
FIG. 5A
FIG. 5B
FIG. 5C

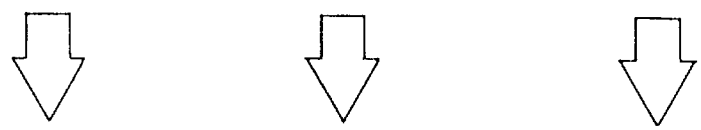
FIG. 7(A)
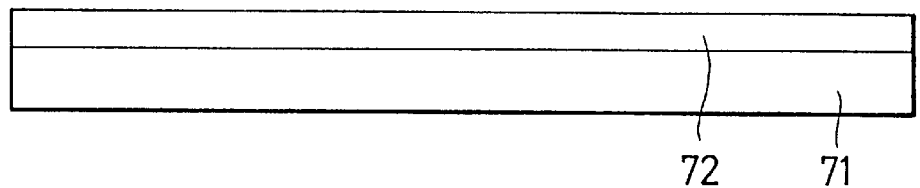
72  71
FIG. 7(B)
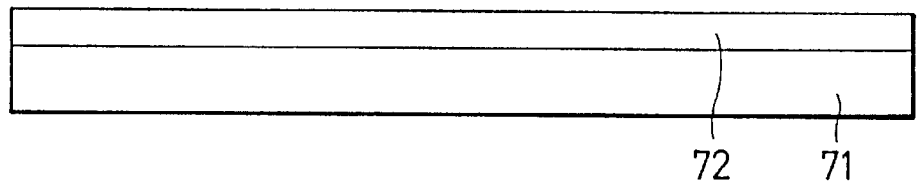
72  71
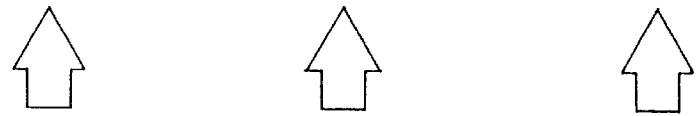

METHOD OF MANUFACTURING A SEMICONDUCTOR DEVICE BY USING A HOMOGENIZED RECTANGULAR LASER BEAM

This is a Divisional application of Ser. No. 08/661,869, filed Jun. 11, 1996, which itself is a division of Ser. No. 08/245,587, filed May 18, 1994; which itself is a division of Ser. No. 08/081,696, filed Jun. 25, 1993.

BACKGROUND OF THE INVENTION

1. Field of the Invention

The present invention relates to a highly reliable laser annealing process suited for use in mass production of semiconductor devices, which enables uniform annealing at high yield. More particularly, the present invention provides a laser annealing process of a deposited film whose crystallinity had been greatly impaired by the damage it had received through processes such as ion irradiation, ion implantation, and ion doping.

2. Prior Art

At present, methods of lowering of process temperatures in fabricating semiconductor devices are extensively studied. The reason for such an active research for low temperature processes owe partly to the need for fabricating semiconductor elements on an insulator substrate made of, e.g., glass. Laser annealing technology is regarded promising as the ultimate low temperature process.

However, conditions for laser annealing are not yet established because conventional laser annealing processes were each conducted independently under differing conditions which depend upon the apparatuses and the coating conditions chosen individually in each process. This has misled and has allowed many to think that the laser annealing technology fails to give results reliable and consistent enough to make the process practically feasible. An object of the present invention is to establish, for the first time, the conditions for a laser annealing process which yields highly reproducible results.

SUMMARY OF THE INVENTION

In a process for fabricating a semiconductor device, a deposition film is considerably damaged by processing such as ion irradiation, ion implantation, and ion doping, and is thereby impaired in crystallinity as to yield an amorphous phase or a like state which is far from being called as a semiconductor. Accordingly, with an aim to use laser annealing in activating such damaged films, the present inventors have studied extensively how to optimize the conditions of laser annealing. During the study, it has been found that the optimum condition fluctuates not only by the energy control of the laser beam, but also by the impurities being incorporated in the film and by the number of pulse shots of the laser beam being applied thereto.

The deposited films to be activated by the process of the present invention are those containing, as the principal component, a Group IV element of the periodic table, e.g., silicon, germanium, an alloy of silicon and germanium, or a compound of the Group IV element such as silicon carbide. The deposited film has a thickness of 100 Å to 10000 Å. By taking the light transmission into consideration, it is well established that the laser annealing of such films can be favorably conducted by applying a laser beam in the short wavelength region, and specifically, one of 400 nm or shorter.

The process of the present invention comprises the step of:

irradiating laser pulses having a wavelength of 400 nm or shorter and having a pulse width of 50 nsec or less to a film comprising a Group IV element selected from the group consisting of carbon, silicon, germanium, tin and lead and having introduced thereinto an impurity ion, wherein a transparent film having a thickness of 3 to 300 nm is provided on said film comprising the Group IV element on the way of said laser pulses to said film comprising the Group IV element, an energy density E of each of said laser pulses in unit of mJ/cm$^2$ and the number N of said laser pulses satisfy relation $\log_{10} N \leq -0.02(E-350)$.

The laser pulses are emitted from a laser selected from the group consisting of a KrF excimer laser, an ArF excimer laser, a XeCl excimer laser and a XeF excimer laser. The introduction of the impurity ion is carried out by ion irradiation, ion implantation or ion doping. The film comprising the Group IV element is provided on an insulating substrate, and the insulating substrate is maintained at a temperature of room temperature to 500° C. during the irradiating step.

It had been believed that the sheet resistance can be lowered by applying a laser beam having an energy density sufficiently high for activation. In the case of a film containing phosphorus as an impurity, this tendency can be certainly observed. However, in a film containing boron as an impurity, the film undergoes degradation by the irradiation of a laser of such a high energy density. Moreover, it had been taken for granted that the increase in pulsed shots reduces fluctuation in properties of the laser annealed films. However, this is not true because it was round that the morphology of the coating deteriorates with increasing number of shots to increase fluctuations in a microscopic level.

This can be explained by the growth of crystal nuclei within the coating due to a laser beam irradiation being applied repeatedly to the film. As a result, a grain size distribution within a size range of from 0.1 to 1 µm appears inside the coating which was previously composed of uniform sized grains. This phenomenon was particularly distinguished when a laser irradiation in the high energy region was applied.

It has been found that the deposited film (i.e. a semiconductor film) must be coated with (covered by) a light-transmitting coating from 3 to 300 nm in thickness instead of being exposed to atmosphere. The light-transmitting coating is preferably made from silicon oxide or silicon nitride from the viewpoint that it should transmit laser beam. More preferably, a material mainly comprising silicon oxide is used because, in general, it also serves as the gate dielectric. Needless to say, the light-transmitting film may be doped with phosphorus or boron with an aim to passivate the mobile ions. If the film containing a Group IV element should not be coated with such a light-transmitting coating, it happens that the uniformity is disturbed in a more accelerated manner.

It has been found also, that a further smoother (uniform) coating can be obtained by applying pulsed laser beam under a condition set forth above and additionally satisfying the following relation:

$$\log_{10} N \leq A(E-B)$$

where, E (mJ/cm$^2$) is the energy density of each of the irradiated laser pulses, and N (shots) is the number of shots of pulsed laser. The values for A and B are dependent on the impurities being incorporated in the coating. When phosphorus is present as the impurity, −0.02 for A and 350 for B are chosen, and an A of −0.02 and B of 300 are selected when boron is included as the impurity.

Similar effect can be attained by using a transparent substrate instead of the transparent film. That is, a laser process in accordance with the present invention comprises the steps of:

introducing an impurity into a semiconductor film provided on a transparent substrate; and irradiating laser pulses having a wavelength of 400 nm or shorter and having a pulse width or 50 nsec or less to said semiconductor film through said transparent substrate, wherein an energy density E of each of said laser pulses in unit of mJ/cm$^2$ and the number N of said laser pulses satisfy relation $\log_{10} N \leq -0.02(E-350)$.

FIG. 7(A) shows the introducing step, and FIG. 7(B) shows the irradiating step. Reference numeral 71 designates the transparent substrate, and 72 designates the semiconductor film.

BRIEF DESCRIPTION OF THE DRAWINGS

FIGS. 5(A), 5(B), and 5(C) show a concept of an optical system of the laser annealing apparatus having used in the embodiments of the present invention;

FIG. 7 shows another laser annealing process in accordance with the present invention.

DETAILED DESCRIPTION OF THE INVENTION

The present invention is illustrated in greater detail referring to a non-limiting example below. It should be understood, however, that the present invention is not to be construed as being limited thereto.

EXAMPLE

Figure 1:
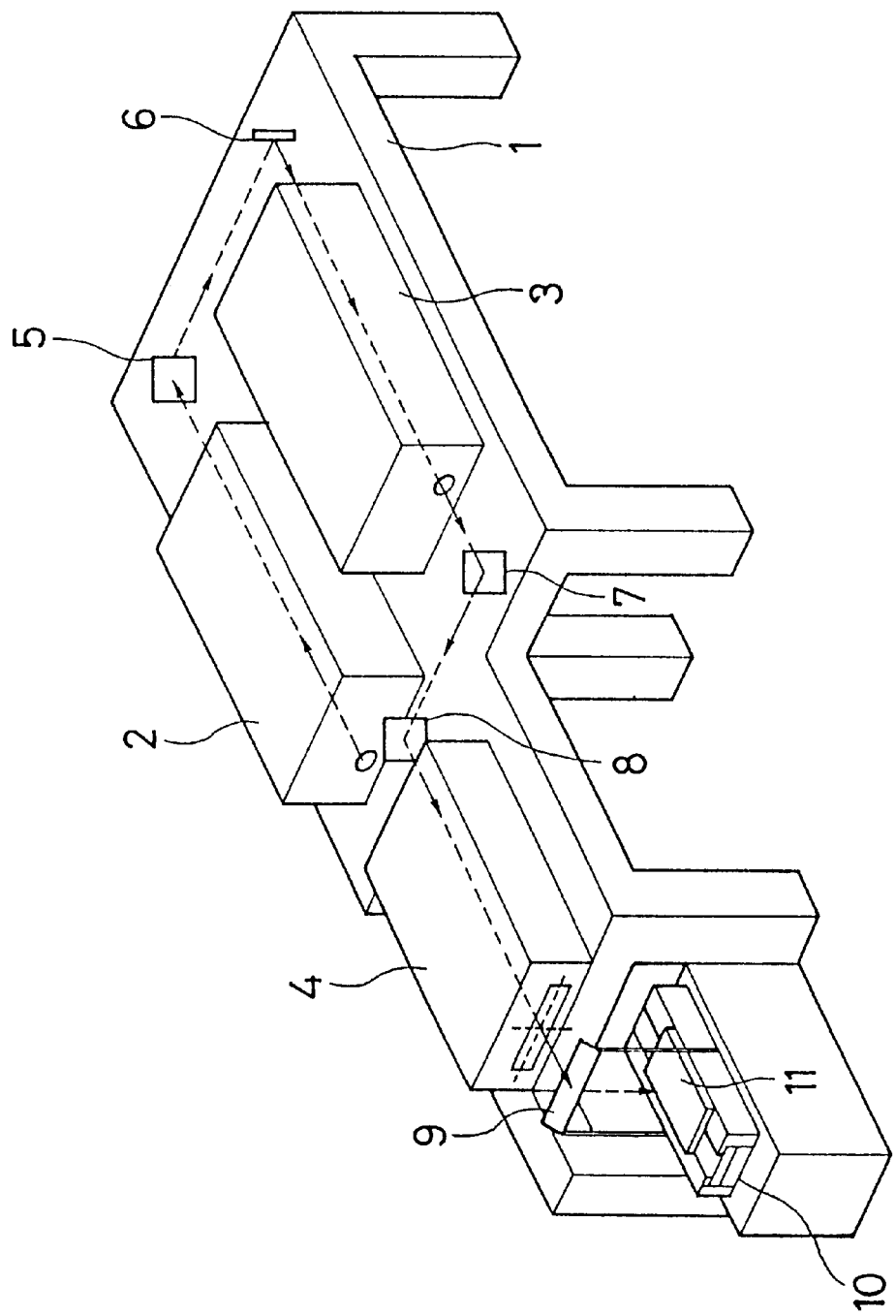
FIG. 1 shows a schematic view of a laser annealing apparatus having used in the embodiments of the present invention.

In this EXAMPLE, an impurity is introduced into a film comprising a Group IV element for imparting one of N-type conductivity and P-type conductivity thereto, and another impurity is introduced into a portion of the film with a mask for imparting the other one of the N-type conductivity and P-type conductivity to said portion. In FIG. 1 is shown schematically a laser annealing apparatus having used in the present example. A laser beam is generated in a generator 2, amplified in an amplifier 3 after traveling through full reflection mirrors 5 and 6, and then introduced in an optical system 4 after passing through full reflection mirrors 7 and 8. The initial laser beam has a rectangular beam area of about 3×2 cm$^2$, but is processed into a long beam having a length of from about 10 to 30 cm and a width of from about 0.1 to 1 cm by the optical system 4. The maximum energy of the laser having passed through this optical system was 1,000 mJ/shot.

An optical path in the optical system 4 is illustrated in FIGS. 5(A), 5(B), and 5(C). A laser light incident on the optical system 4 passes through a cylindrical concave lens A, a cylindrical convex lens B, a fly-eye lens C provided in a lateral direction and a fly-eye lens D provided in a vertical direction. The laser light is changed from an initial gauss distribution to a rectangular distribution by virtue of the fly-eye lenses C and D. Further, the laser light passes through a cylindrical convex lenses E and F and is reflected on a mirror G (a mirror 9 in FIG. 1) and is focused on the specimen by a cylindrical lens H.

In this EXAMPLE, distances $X_1$ and $X_2$ indicated in FIG. 5 are fixed, and a distance $X_3$ between a focus I of the lens E and the mirror G, distances $X_4$ and $X_5$ are varied to adjust a magnification M and a focal length F. That is, $M=(X_3+X_4)/X_5$ $1/F=1/(X_3+X_4)+1/X_5$.

In this EXAMPLE, a total length $X_6$ of the optical path is about 1.3 m.

The initial beam is modified into a long-shaped one as above to improve processability thereof. More specifically, the rectangular beam which is irradiated onto a specimen 11 through the full reflection mirror 9 after departing the optical system 4 has a longer width as compared with that of the specimen that, as a consequence, the specimen need to be moved only along one direction. Accordingly, the stage on which the specimen is mounted and the driving apparatus 10 can be made simple structured that the maintenance operation therefor can be easily conducted. Furthermore, the alignment operation at setting the specimen can also be greatly simplified.

If a beam having a square cross section were to be employed, on the other hand, it becomes impossible to cover the entire substrate with a single beam. Accordingly, the specimen should be moved two dimensionally along two directions. In such circumstances, however, the driving apparatus of the stage becomes complicated and the alignment also must be done in a two dimensional manner that it involves much difficulty. When the alignment is done manually, in particular, a considerable time is consumed for this step to greatly reduce the productivity of the entire process. Furthermore, those apparatuses must be fixed on a stable table 1 such as a vibration proof table.

The specimen used in the example were various types of glass substrates (e.g., a Corning #7059 glass substrate) 100 mm in length and from 100 to 300 mm in width. A KrF laser emitting light at a wavelength of 248 nm and at a pulse width of 50 nsec or less, e.g. 30 nsec, was used in the process.

Figure 6A:
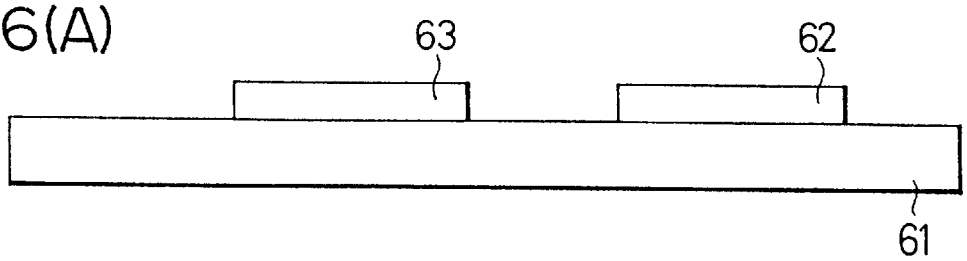
FIG. 6 shows a laser annealing process in accordance with the present invention.
Figure 6B:
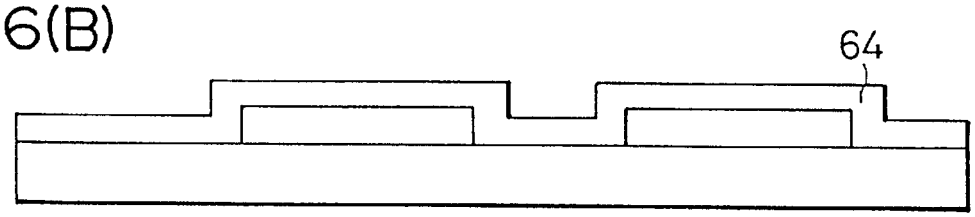
Figure 6C:
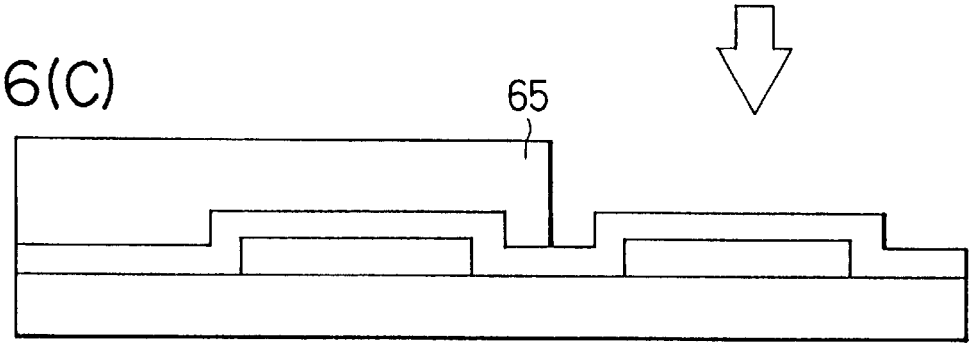

A 100 nm thick amorphous silicon film was deposited on a glass substrate 61 by plasma assisted CVD (chemical vapor deposition) process. The resulting film was annealed at 600° C. for 48 hours to obtain a crystallized film, and was patterned to make island-like portions 62 and 63 (FIG. 6(A)). Furthermore, a 70 nm thick silicon oxide film (a light-transmitting coating) 64 was deposited thereon by sputtering and the entire surface of the substrate was doped with phosphorus. A so-called ion doping process (FIG. 6(B)) was employed in this step using phosphine (PH$_3$) as the plasma source and an accelerating voltage of 80 kV. Furthermore, a part of the substrate was masked 65 to implant boron by ion doping process (FIG. 6(C)). Diborane (B$_2$H$_6$) was used as the plasma source in this step while accelerating at a voltage of 65 kV. More specifically, phosphorus was implanted (introduced) into the masked portions through the light-transmitting coating to obtain portion having rendered N-type conductive, while both phosphorus and boron were implanted (introduced) into the unmasked portions through the light-transmitting coating to result in a portion having rendered P-type conductive.

Then, laser beam was irradiated to the island-like portions (semiconductor film) while varying the energy density and the number of pulse shots to effect laser activation. The sheet resistance was measured accordingly and the morphology of the crystallites constituting the coating was observed through an optical microscope. The results are summarized in FIGS. 2 to 4.

Figure 2:
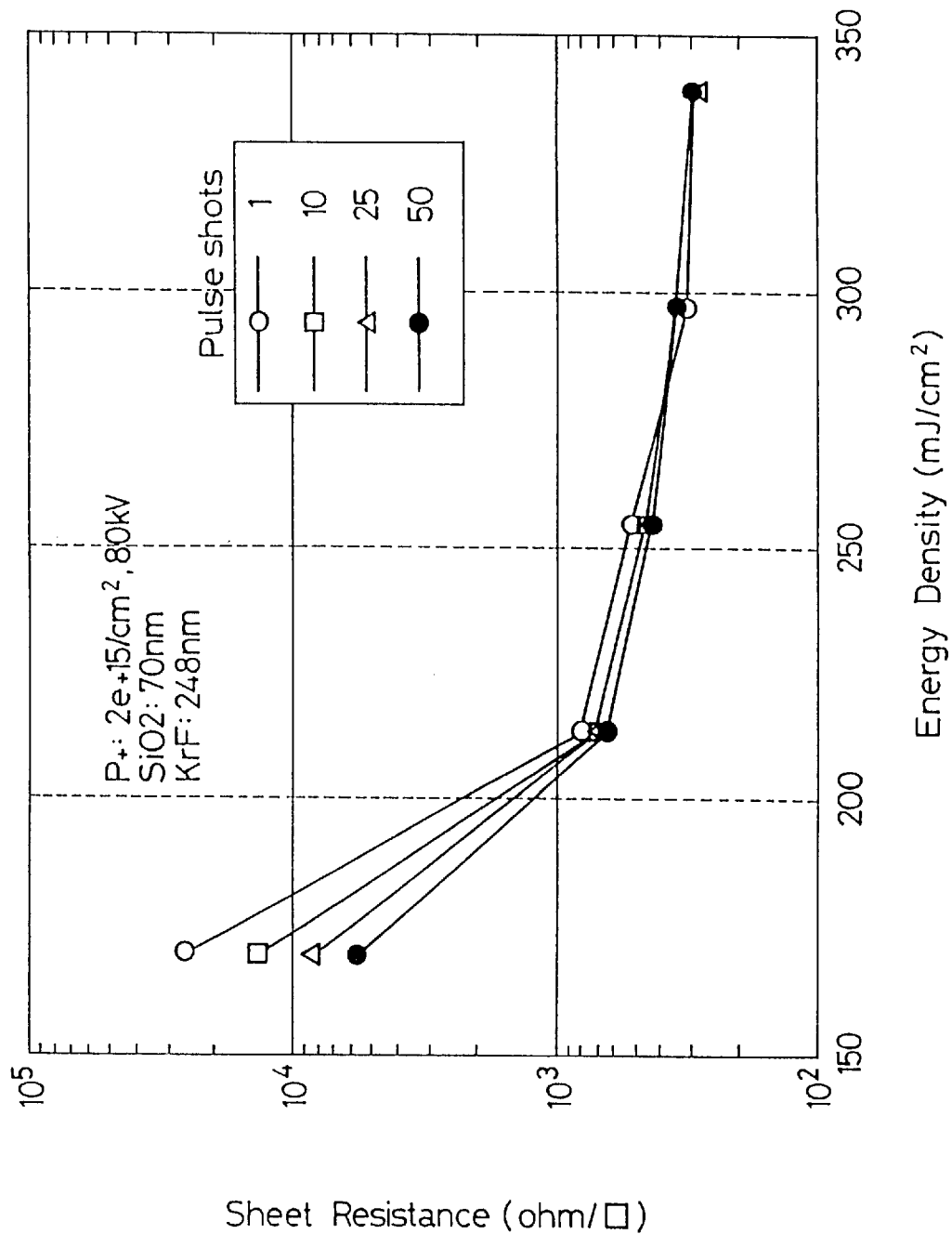
FIG. 2 is a graph showing the relationship between the sheet resistance of a silicon film (phosphorus-doped, N-type) obtained by laser annealing according to an embodiment of the present invention and the applied laser energy density, while changing the repetition times of pulse shots.

FIG. 2 shows a graph which relates the sheet resistance of a silicon film having doped with phosphorus ions with the energy density of the laser beam while also changing the repetition of the pulse shots. Phosphorus was incorporated into the silicon film at a dose of 2×10$^{15}$ cm$^{-2}$. With a laser being operated at an energy density of 200 mJ/cm$^2$ or less, a large number of shots were necessary to activate the sheet, yet with a poor result yielding a high sheet resistance of about 10 kΩ/sq. However, with a laser beam having an energy density of 200 mJ/cm$^2$ or higher, a sufficient activation was realized with a laser operation of from 1 to 10 shots.

Figure 3:
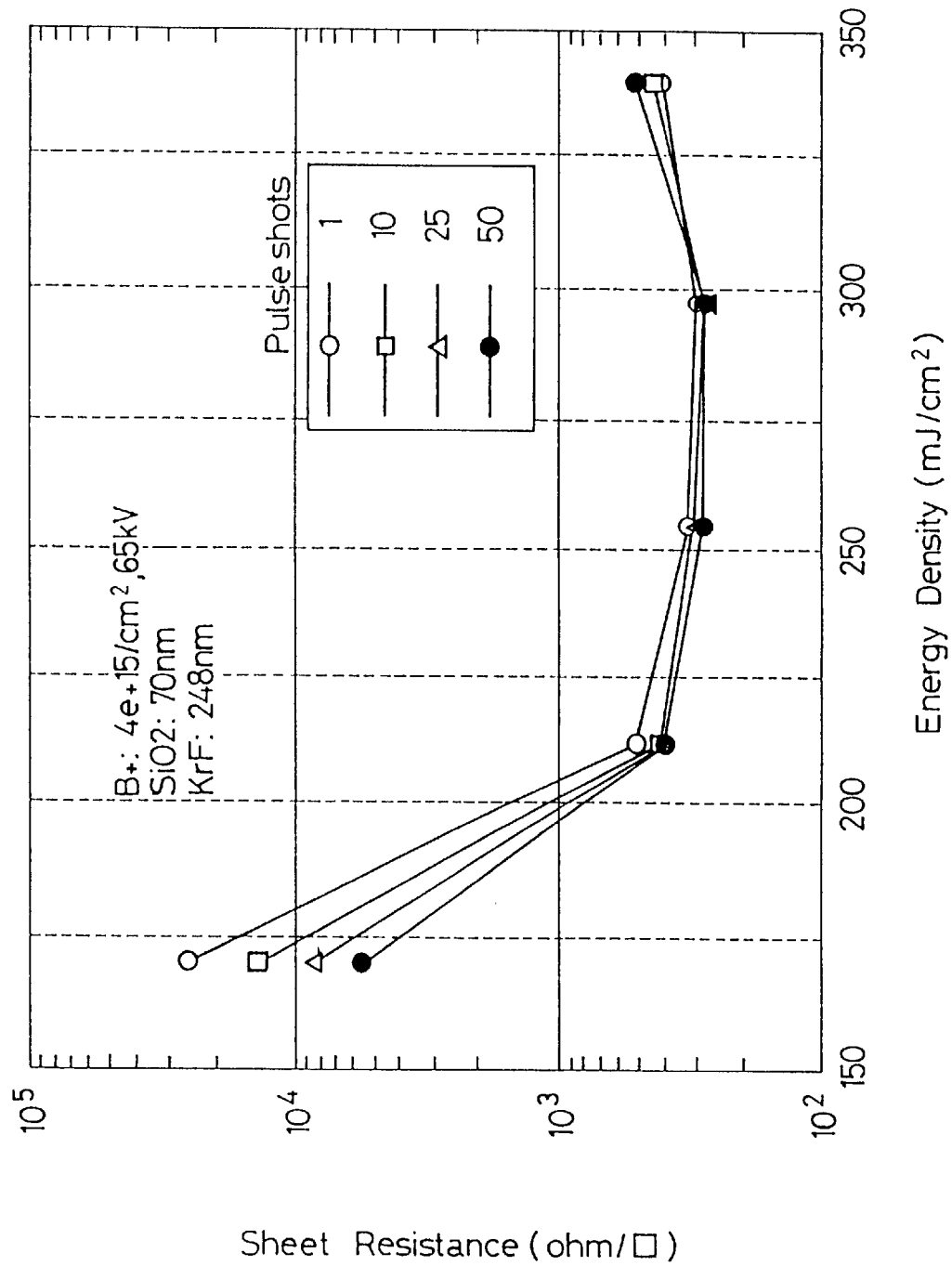
FIG. 3 is a graph showing the relationship between the sheet resistance of a silicon film (phosphorus- and boron-doped, P-type) obtained by laser annealing according to an embodiment of the present invention and the applied laser energy density, while changing the repetition times of pulse shots.

In FIG. 3 is shown the results for laser activating a silicon film doped with boron ions at a dose of 4×10$^{15}$ cm$^{-2}$. In this case again, activation could be conducted only insufficiently with an energy density of 200 mJ/cm$^2$ or lower that a large number of pulse shots was required for sufficient activation. With a laser beam operated at an energy density of from 200 to 300 mJ/cm$^2$ a sufficiently low sheet resistance was obtained with 1 to 10 shots. However, with laser being operated at an energy density of 300 mJ/cm$^2$ or higher, on the other hand, the sheet resistance was reversely elevated. In particular, contrary to the case of activating with a laser beam energy density of 200 mJ/cm$^2$ or lower, the sheet resistance was elevated with increasing repetition of pulse shots. This phenomenon can be explained by the growth of grain boundary due to the impaired homogeneity of the film which had resulted by applying laser irradiation for too many shots.

Figure 6D:
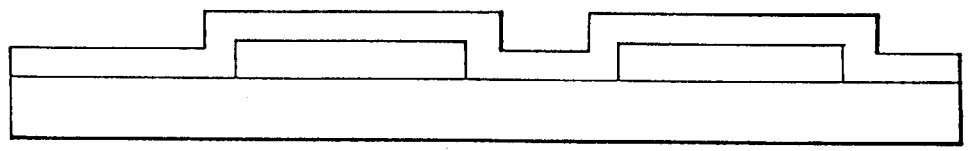

In a practical process, the laser annealing is applied simultaneously to both P- and N-type regions as shown in FIG. 6(D). This signifies that a laser beam being irradiated at an energy density of 350 mJ/cm$^2$ sufficiently activates the N-type region while impairing the properties of the P-type region. Accordingly, in the process according to the present example, it is preferred that the laser beam is operated in an energy density range of from 200 to 300 mJ/cm$^2$ and more preferably, in a range of from 250 to 300 mJ/cm$^2$. The pulse repetition is preferably in the range of from 1 to 100 pulses.

Figure 4:
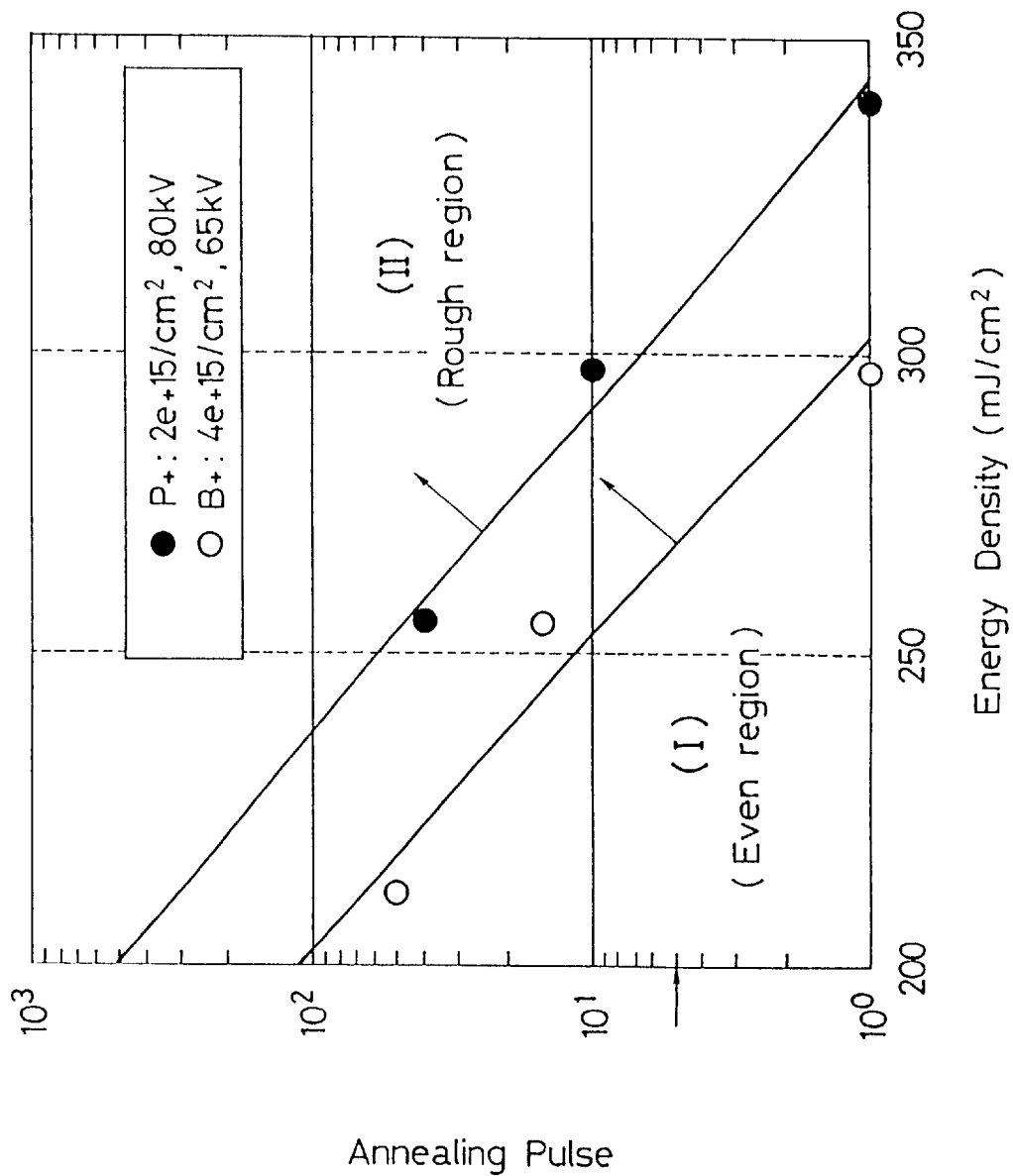
FIG. 4 is a graph showing the relation between the morphology of the silicon film obtained in an embodiment of the present invention and the applied laser energy density and the repetition times of the pulse shots.

As described in the foregoing, the morphology of the deposited film is considerably influenced by laser annealing. In fact, the number of pulse shots can be related to the laser beam energy density and the film morphology as illustrated in FIG. 4. In FIG. 4, the term "Annealing Pulse" signifies the number of laser beam pulse shots. The solid circle in the figure represents the point at which a change in surface morphology was observed on a phosphorus-doped silicon, and the open circle represents the same on a boron-doped silicon. The upper region on the right hand side of the figure corresponds to a condition which yields poor morphology on the surface (rough surface), and the lower region on the left hand side of the figure corresponds to that which yields favorable morphology on the surface (smooth surface). It can be seen from the results that the phosphorus-doped silicon has a strong resistance against laser irradiation. Accordingly, the condition for conducting laser annealing without impairing the surface morphology can be read to be such which satisfies the relation:

$$\log_{10} N \leq A(E-B),$$

where, E (mJ/cm$^2$) is the energy density of the irradiated laser beam, and N (shots) is the number of shots of pulsed laser. The values for A and B are A=−0.02 and B=350 in the case phosphorus is incorporated as the impurity, and are A=−0.02 and B=300 when boron is included as the impurity.

When the morphology or the deposited film is considerably impaired, the characteristic values show large scattering due to the serious drop which occurs locally in the properties of silicon. In fact, a scattering in sheet resistance as high as 20% or even more was observed on a silicon film having a defective morphology (a rough surface). This scattering can be removed by satisfying the conditions above and by setting the laser energy density at a pertinent value.

For instance, when a laser energy density is set at 250 mJ/cm$^2$, the pulsed laser beam is shot at a frequency of 10 times or less. If the energy density is elevated to 280 mJ/cm$^2$, the laser beam is preferably shot at a frequency of from 1 to 3 times. By conducting laser annealing under such conditions, the sheet resistance could be controlled within a fluctuation of 10% or less.

According to the present invention, a highly reliable semiconductor film having low fluctuation in properties was obtained by setting the optimal conditions for laser annealing as described in the foregoing. It can be seen therefore that the process according to the present invention is beneficial to the semiconductor industry.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device having a semiconductor layer comprising the steps of:

emitting a laser beam having a cross section with a width and a length;

homogenizing an energy distribution of said laser beam in a widthwise direction of the cross section using a lateral flyeye lens;

homogenizing an energy distribution of said laser beam in a lengthwise direction of the cross section by using a vertical flyeye lens;

condensing the laser beam after passing through said lateral flyeye lens only in the widthwise direction by using a first cylindrical convex lens;

condensing said laser beam after passing through said first vertical flyeye lens only in the lengthwise direction by using a second cylindrical convex lens;

condensing the laser beam after passing through said first and second cylindrical convex lenses only in said widthwise direction; and irradiating a semiconductor layer with the laser beam after passing through said first, second and third cylindrical convex lenses, wherein said third cylindrical convex lens is located distant from said first cylindrical convex lens by a distance larger than focal length of said first cylindrical convex lens;

scanning said semiconductor layer with the condensed laser beam condensed by said third cylindrical convex lens by relatively moving said semiconductor layer with respect to said condensed laser beam in a direction along a widthwise direction of the cross section.

2. A method according to claim 1 wherein said semiconductor layer is annealed by said laser beam condensed by said third cylindrical convex lens.

3. A method of manufacturing a semiconductor device comprising the steps of:

emitting a laser beam having a first cross section;

homogenizing an energy density of said laser beam in a widthwise direction of the cross section using a lateral flyeye lens;

condensing the laser beam at passing through the lateral flyeye lens only in the widthwise direction by using a first cylindrical convex lens;

condensing the laser beam after passing through said first cylindrical convex lens only in the widthwise direction using a second cylindrical convex lens;

irradiating a semiconductor layer with the laser beam having passed through said second cylindrical convex lens, wherein said second cylindrical convex lens is distant from said first cylindrical convex lens by a distant larger than a focal length of said first cylindrical convex lens;

scanning said semiconductor layer with laser beam by relatively moving said semiconductor layer with respect to said condensed laser beam in a direction along a widthwise direction of the cross section.

4. A method according to claims 1 or 3 wherein said laser beam is an excimer laser beam.

5. A method according to claims 1 or 3 wherein the cross section of said laser beam has a rectangular shape.

6. A method of manufacturing a semiconductor device comprising the steps of:

emitting a laser beam having a first cross section;

homogenizing an energy density of said laser beam in a widthwise direction of the cross section using a lateral flyeye lens;

condensing the laser beam after passing through the lateral flyeye lens only in the widthwise direction by using a first cylindrical convex lens;

condensing the laser beam after passing through said first cylindrical convex lens only in the widthwise direction using a second cylindrical convex lens;

irradiating a semiconductor layer with the laser beam having passed through said second cylindrical convex lens, wherein a focal length F of the second cylindrical convex lens satisfies the following condition:

$1/F=1/$(an optical path length between the focus of the first cylindrical convex lens and the second cylindrical convex lens)+$1/$(an optical path length between the second cylindrical convex lens and the semiconductor layer);

scanning said semiconductor layer with the condensed laser beam condensed by said second cylindrical convex lens by relatively moving said semiconductor layer with respect to said condensed laser beam in a direction along a widthwise direction of the cross section.

7. A method of manufacturing a semiconductor device comprising the steps of:

emitting a laser beam having a cross section perpendicular to a propagation thereof;

homogenizing an energy distribution of said laser beam in a widthwise direction of the cross section by using a lateral flyeye lens;

condensing the laser beam having passed through the lateral flyeye lens only in the widthwise direction by using a first cylindrical convex lens;

condensing the laser beam having passed through the first cylindrical convex lens only in the widthwise direction by using a second cylindrical convex lens; and irradiating a semiconductor layer with the laser beam condensed by said second cylindrical convex lens;

wherein a magnification M satisfies the following relation: M=(an optical path length between the focus of said first cylindrical convex lens and the second cylindrical convex lens)/(an optical path length between the second cylindrical convex lens and the semiconductor layer);

scanning said semiconductor layer with the condensed laser beam by relatively moving said semiconductor layer with respect to said condensed laser beam in a direction along a widthwise direction of the cross section.

8. A method of manufacturing a semiconductor device having a semiconductor layer comprising the steps of:

emitting a laser beam having a rectangular cross section perpendicular to a propagation thereof;

modifying an energy distribution of said laser beam in a widthwise direction of the cross section by using a lateral flyeye lens;

condensing the laser beam having passed through said lateral flyeye lens only in the widthwise direction by using a first cylindrical convex lens;

directing said laser beam having passed through said first cylindrical convex lens toward a semiconductor layer by using a mirror;

condensing said laser beam in said widthwise direction by using a second cylindrical convex lens, said second cylindrical convex lens being located on an optical path between said mirror and said semiconductor layer; and irradiating said semiconductor layer with said laser beam having passed through said second cylindrical convex lens, wherein a distance $X_3$ between a focus of said first cylindrical convex lens and the mirror, a distance $X_4$ between the mirror and said second cylindrical convex lens, a distance $X_5$ between said second cylindrical convex lens and said semiconductor layer satisfy the following conditions;

$M=(X_3+X_4)/X_5$ where M is a magnification, and $1/F=1/(X_3+X_4)+1/X_5$, F is a focal distance of the second cylindrical convex lens.

9. A method of manufacturing a semiconductor device comprising the steps of:

emitting a laser beam having a rectangular cross section perpendicular to a propagation thereof;

modifying an energy distribution of said laser beam in a widthwise direction of the cross section by using a lateral flyeye lens;

condensing the laser beam having passed through said lateral flyeye lens only in the widthwise direction by using a first cylindrical convex lens;

directing said laser beam having passed through said first cylindrical convex lens toward a semiconductor layer by using a mirror;

condensing said laser beam in said widthwise direction by using a second cylindrical convex lens, said second cylindrical convex lens being located on an optical path between said mirror and said semiconductor layer; and irradiating said semiconductor layer with said laser beam having passed through said second cylindrical convex lens, wherein a distance $X_3$ between a focus of said first cylindrical convex lens and the mirror, a distance $X_4$ between the mirror and said second cylindrical convex lens, a distance $X_5$ between said second cylindrical convex lens and said semiconductor layer satisfy the following conditions;

$M=(X_3+X_4)X_5$ where M is a magnification;

scanning said semiconductor layer with the condensed laser beam by relatively moving said semiconductor layer with respect to said condensed laser beam in a direction along a widthwise direction of the cross section.

10. A method according to claims 3, 6, 7, 8, or 9 wherein said semiconductor layer is annealed by the laser beam condensed by said second cylindrical convex lens.

11. A method of manufacturing a semiconductor device comprising the steps of:

emitting a laser beam having a rectangular cross section perpendicular to a propagation thereof;

modifying an energy distribution of said laser beam in a widthwise direction of the cross section by using a lateral flyeye lens;

condensing the laser beam having passed through said lateral flyeye lens only in the widthwise direction by using a first cylindrical convex lens;

directing said laser beam having passed through said first cylindrical convex lens toward a semiconductor layer by using a mirror;

condensing said laser beam in said widthwise direction by using a second cylindrical convex lens, said second cylindrical convex lens being located on an optical path between said mirror and said semiconductor film; and irradiating said semiconductor layer with said laser beam having passed through said second cylindrical convex lens, wherein a distance $X_3$ between a focus of said first cylindrical convex lens and the mirror, a distance $X_4$ between the mirror and said second cylindrical convex lens, a distance $X_5$ between said second cylindrical convex lens and said object satisfy the following conditions;

$1/F=1/(X_3+X_4)+1/X_5$, F is a focal distance of the second cylindrical convex lens;

scanning said semiconductor layer with the condensed laser beam by relatively moving said semiconductor layer with respect to said condensed laser beam in a direction along a widthwise direction of the cross section.

12. A method of manufacturing a semiconductor device having a semiconductor layer comprising the steps of:

emitting a laser beam having a cross section with a width and a length;

modifying an energy distribution of said laser beam in a widthwise direction of the cross section using a lateral flyeye lens;

modifying an energy distribution of said laser beam in a lengthwise direction of the cross section by using a vertical flyeye lens;

condensing the laser beam after passing through said lateral flyeye lens only in the widthwise direction by using a first cylindrical convex lens;

condensing said laser beam after passing through said first vertical flyeye lens only in the lengthwise direction by using a second cylindrical convex lens;

condensing the laser beam after passing through said first and second cylindrical convex lenses only in said widthwise direction; and irradiating a semiconductor layer with the laser beam after passing through said first, second and third cylindrical convex lenses, wherein said third cylindrical convex lens is located distant from said first cylindrical convex lens by a distance larger than focal length of said first cylindrical convex lens;

scanning said semiconductor layer with the condensed laser beam condensed by said third cylindrical convex lens by relatively moving said semiconductor layer with respect to said condensed laser beam in a direction along a widthwise direction of the cross section.

13. A method of manufacturing a semiconductor device comprising the steps of:

emitting a laser beam having a first cross section;

modifying an energy density of said laser beam in a widthwise direction of the cross section using a lateral flyeye lens;

condensing the laser beam after passing through the lateral flyeye lens only in the widthwise direction by using a first cylindrical convex lens;

condensing the laser beam after passing through said first cylindrical convex lens only in the widthwise direction using a second cylindrical convex lens;

irradiating a semiconductor layer with the laser beam having passed through said second cylindrical convex lens, wherein said second cylindrical convex lens is distant from said first cylindrical convex lens by a distant larger than a focal length of said first cylindrical convex lens;

scanning said semiconductor layer with laser beam by relatively moving said semiconductor layer with respect to said condensed laser beam in a direction along a widthwise direction of the cross section.

14. A method of manufacturing a semiconductor device comprising the steps of:

emitting a laser beam having a first cross section;

modifying an energy density of said laser beam in a widthwise direction of the cross section using a lateral flyeye lens;

condensing the laser beam after passing through the lateral flyeye lens only in the widthwise direction by using a first cylindrical convex lens;

condensing the laser beam after passing through said first cylindrical convex lens only in the widthwise direction using a second cylindrical convex lens;

irradiating a semiconductor layer with the laser beam having passed through said second cylindrical convex lens, wherein a focal length F of the second cylindrical convex lens satisfies the following condition:

1/F=1/(an optical path length between the focus of the first cylindrical convex lens and the second cylindrical convex lens)+1/(an optical path length between the second cylindrical convex lens and the semiconductor layer);

scanning said semiconductor layer with the condensed laser beam condensed by said second cylindrical convex lens by relatively moving said semiconductor layer with respect to said condensed laser beam in a direction along a widthwise direction of the cross section.

15. A method of manufacturing a semiconductor device comprising the steps of:

emitting a laser beam having a cross section perpendicular to a propagation thereof;

modifying an energy distribution of said laser beam in a widthwise direction of the cross section by using a lateral flyeye lens;

condensing the laser beam having passed through the lateral flyeye lens only in the widthwise direction by using a first cylindrical convex lens;

condensing the laser beam having passed through the first cylindrical convex lens only in the widthwise direction by using a second cylindrical convex lens; and irradiating a semiconductor layer with the laser beam condensed by said second cylindrical convex lens;

wherein a magnification M satisfies the following relation: M=(an optical path length between the focus of said first cylindrical convex lens and the second cylindrical convex lens)/(an optical path length between the second cylindrical convex lens and the semiconductor layer);

scanning said semiconductor layer with the condensed laser beam by relatively moving said semiconductor layer with respect to said condensed laser beam in a direction along a widthwise direction of the cross section.

16. A method of manufacturing a semiconductor device having a semiconductor layer comprising the steps of:

emitting a laser beam having a cross section with a first width and a first length;

modifying an energy distribution of said laser beam in a widthwise direction of the cross section using a lateral flyeye lens;

modifying an energy distribution of said laser beam in a lengthwise direction of the cross section by using a vertical flyeye lens;

condensing the laser beam after passing through said lateral flyeye lens only in the widthwise direction by using a first cylindrical convex lens;

condensing said laser beam after passing through said first vertical flyeye lens only in the lengthwise direction by using a second cylindrical convex lens;

condensing the laser beam after passing through said first and second cylindrical convex lenses only in said widthwise direction; and irradiating a semiconductor layer with the laser beam after passing through said first, second and third cylindrical convex lenses, wherein said third cylindrical convex lens is located distant from said first cylindrical convex lens by a distance larger than focal length of said first cylindrical convex lens;

scanning said semiconductor layer with the condensed laser beam condensed by said third cylindrical convex lens by relatively moving said semiconductor layer with respect to said condensed laser beam in a direction along a widthwise direction of the cross section, wherein a cross section of said laser beam at said semiconductor layer has a second width which is smaller than said first width and a second length which is greater than said first length.

* * * * *

UNITED STATES PATENT AND TRADEMARK OFFICE
CERTIFICATE OF CORRECTION

PATENT NO.     : 6,002,101
DATED          : December 14, 1999
INVENTOR(S)    : Shunpei Yamazaki et al.

It is certified that error appears in the above-identified patent and that said Letters Patent is hereby corrected as shown below:

<u>Title page,</u>
OTHER PUBLICATIONS, please change "Englargement" to read -- Enlargement --.
In the Semiconductor World reference, please change "1993" to read
-- Oct. 1, 1992 --

Item [56], FOREIGN PATENT DOCUMENTS, please make the following changes and deletions:
    delete "176715  3/1989  Japan"
    change "1186814" to read -- 1-187814 --
    delete "64-76715  7/1989   Japan"
    change "1239837  12/1989" to read -- 1-239837  9/1989 --
    change "220681" to read -- 2-20681 --
    change "2294027" to read -- 2-294027 --; and
    change "2255292  7/1991" to read -- 2-255292  10/1990 --

Illustrative Figure, above total length $X_6$, the converging arrows should appear as converging lines without arrow heads thereby forming a continuous line so that the total length $X_6$ extends from lens A to the end of distance $X_5$.

<u>Drawings,</u>
Sheet 5, Fig. 5B, above total length $X_6$, the converging arrows should appear as converging lines without arrow heads thereby forming a continuous line so that the total length $X_6$ extends from lens A to the end of distance $X_5$.

<u>Column 6,</u>
Line 59, delete "first";
Line 64, after "direction" insert -- by using a third cylindrical convex lens --

<u>Column 7,</u>
Line 20, after "beam" delete "at" and insert -- after --;
Line 31, after "a" delete "distant" and insert -- distance --;

<u>Column 10,</u>
Line 10, delete "first";
Line 15, after "direction" insert -- by using a third cylindrical convex lens --.

UNITED STATES PATENT AND TRADEMARK OFFICE
CERTIFICATE OF CORRECTION

PATENT NO.    : 6,002,101
DATED         : December 14, 1999
INVENTOR(S)   : Shunpei Yamazaki et al.

It is certified that error appears in the above-identified patent and that said Letters Patent is hereby corrected as shown below:

Column 12,
Line 15, delete "first";
Line 21, after "direction" insert -- by using a third cylindrical convex lens --.

Signed and Sealed this

Twenty-ninth Day of October, 2002

Attest:

JAMES E. ROGAN
Director of the United States Patent and Trademark Office

Attesting Officer

UNITED STATES PATENT AND TRADEMARK OFFICE
CERTIFICATE OF CORRECTION

PATENT NO.    : 6,002,101
DATED         : December 14, 1999
INVENTOR(S)   : Shunpei Yamazaki et al.

It is certified that error appears in the above-identified patent and that said Letters Patent is hereby corrected as shown below:

Title page,
Item [56], References Cited, OTHER PUBLICATIONS,
Please change "Englargement" to read -- Enlargement --.
In the Semiconductor World reference, please change "1993" to read -- Oct. 1, 1992 --.

FOREIGN PATENT DOCUMENTS, please make the following changes and deletions:
Delete "176715  3/1989  Japan".
Change "1186814" to read -- 1-187814 --;
Delete "64-76715  7/1989  Japan";
Change "1239837  12/1989" to read -- 1-239837  9/1989 --;
Change "220681" to read -- 2-20681 --;
Change "2294027" to read -- 2-294027 --; and
Change "2255292  7/1991" to read -- 2-255292  10/1990 --.

Illustrative Figure,
Above total length $X_6$, the converging arrows should appear as converging lines without arrow heads thereby forming a continuous line so that the total length $X_6$ extends from lens A to the end of distance $X_5$.

Drawings,
Sheet 5, Fig. 5B, above total length $X_6$, the converging arrows should appear as converging lines without arrow heads thereby forming a continuous line so that the total length $X_6$ extends from lens A to the end of distance $X_5$.

Column 6,
Line 59, delete "first";
Line 64, after "direction" insert -- by using a third cylindrical convex lens --

Column 7,
Line 20, after "beam" delete "at" and insert -- after --;
Line 31, after "a" delete "distant" and insert -- distance --;

UNITED STATES PATENT AND TRADEMARK OFFICE
CERTIFICATE OF CORRECTION

PATENT NO.    : 6,002,101
DATED         : December 14, 1999
INVENTOR(S)   : Shunpei Yamazaki et al.

It is certified that error appears in the above-identified patent and that said Letters Patent is hereby corrected as shown below:

Column 10,
Line 10, delete "first";
Line 15, after "direction" insert -- by using a third cylindrical convex lens --.

Column 12,
Line 15, delete "first";
Line 21, after "direction" insert -- by using a third cylindrical convex lens --.

Signed and Sealed this

Twelfth Day of November, 2002

*Attest:*

JAMES E. ROGAN
*Attesting Officer*  *Director of the United States Patent and Trademark Office*